(12) United States Patent
Liberatore et al.

(10) Patent No.: US 6,191,934 B1
(45) Date of Patent: Feb. 20, 2001

(54) HIGH DIELECTRIC CONSTANT EMBEDDED CAPACITORS

(75) Inventors: Michael James Liberatore, Lawrenceville; Attiganal Narayanaswamy Sreeram, Plainsboro; Ashok Narayan Prabhu, East Windsor, all of NJ (US); In-Tae Kim; Je-Do Mun, both of Kyunggi-Do (KR); Sung-Dae Park; Yun-Hwi Park, both of Seoul (KR); Joo-Dong Yu, Kyunggi-Do (KR); Ellen S. Tormey, Princeton Junction, NJ (US)

(73) Assignees: Sarnoff Corporation & Co., Ltd., Princeton, NJ (US); Daewoo Electronics Co., Ltd., Seoul (KR)

( * ) Notice: Under 35 U.S.C. 154(b), the term of this patent shall be extended for 0 days.

(21) Appl. No.: 09/211,668

(22) Filed: Dec. 14, 1998

Related U.S. Application Data

(60) Provisional application No. 60/102,773, filed on Oct. 2, 1998.

(51) Int. Cl.[7] ............................. H01G 4/06; H01G 4/20; C04B 35/46
(52) U.S. Cl. ...................... 361/313; 361/320; 361/321.2; 361/321.5; 501/137
(58) Field of Search .................................. 361/313, 301.4, 361/306.3, 311–312, 320, 321.1–321.5, 322; 501/136–138, 134; 29/25.42; 156/89.11, 320; 428/209–210, 212, 901, 432; 174/52.4

(56) References Cited

U.S. PATENT DOCUMENTS

| | | | |
|---|---|---|---|
| 5,011,803 | * 4/1991 | Park et al. | 501/136 |
| 5,024,975 | 6/1991 | H. Hartmann . | |
| 5,183,786 | * 2/1993 | Gejima et al. | 501/321.5 |
| 5,400,210 | 3/1995 | N. Sugimoto . | |
| 5,561,587 | * 10/1996 | Sanada | 361/306.1 |
| 5,708,570 | * 1/1998 | Polinski, Sr. | 361/762 |
| 5,876,538 | 3/1999 | K. Steinle . | |
| 5,953,203 | * 9/1999 | Tormey et al. | 361/313 |

OTHER PUBLICATIONS

International Search Report for International PCT Application No. PCT/US99/22890 dated Mar. 14, 2000.

* cited by examiner

Primary Examiner—Kristine Kincaid
Assistant Examiner—Eric Thomas
(74) Attorney, Agent, or Firm—William J. Burke

(57) ABSTRACT

High dielectric constant capacitors are made from a dielectric ink of lead-magnesium-niobate and lead oxide powders. Dielectric inks are made by mixing the dielectric powders with a suitable organic vehicle which can be used to coat one or more glass-based green tapes. Buried capacitors are made by coating an overlying and an underlying green tape with a conductor such as silver. Capacitors can also be made by adjusting the organic vehicle and forming a green tape from the dielectric powders. These dielectric green tapes each can be coated with a conductive layer and stacked, the conductive layers connected in parallel. The resultant multilayer capacitors have a very high dielectric constant, while eliminating the need for very large area capacitors, as compared to single layer capacitors.

19 Claims, 1 Drawing Sheet

HIGH DIELECTRIC CONSTANT EMBEDDED CAPACITORS

This application claims priority from U.S. provisional patent application, Ser. No. 60/102,773 filed Oct. 2, 1998.

This invention relates to multilayer ceramic printed circuit boards including buried co-fired passive components. More particularly, this invention relates to multilayer ceramic printed circuit boards including embedded capacitors having a high dielectric constant and methods of making them.

BACKGROUND OF THE INVENTION

Low temperature firing multilayer ceramic circuit boards are known that are suitable for use with low melt temperature conductive metals, such as silver, gold and copper. They have a low thermal coefficient of expansion (TCE) and they may be made to be compatible with both silicon and gallium arsenide devices. These ceramic circuit boards are made from glasses that can be fired at temperatures of less than 1000° C. They are made by admixing finely divided selected glass particles or powders with organic materials, such as resin, solvents, dispersants and the like, and then the resultant slurry is cast as a thin tape, called green tape. A circuit pattern may be screen printed onto the green tape using a conductive ink formulation comprising a conductive metal powder, an organic vehicle and a powdered glass, generally the same as, or a similar glass, to that used to make the green tape.

When a plurality of green tapes are used, via holes are punched into the tapes, which vias are then filled with a conductive via fill ink, made with a conductive powder, an organic vehicle and a suitable glass, to provide electrical contact between the circuits on adjacent green tape layers. When all of the desired green tapes have been patterned, they are aligned and laminated under heat and pressure prior to firing.

More recently, the multilayer ceramic circuit boards have been adhered to a metal support substrate which increases the strength of the multilayer board. When a bonding glass is used to adhere the green tapes to the support substrate, an additional advantage is obtained because the bonding glass reduces the shrinkage of the green tapes during firing in the x and y dimensions, so that most of the shrinkage occurs only in the z, or thickness, dimension. This means the printed circuits can be made with closer tolerances. The glasses used in the green tapes however, must have a TCE matched to that of the metal support to prevent delamination or cracking of the fired glass. Mixtures of crystallizable and non-crystallizable glasses can be used, and inorganic fillers can also be added so that the TCE of the green tape glasses match that of the metal support.

Passive components such as resistors and capacitors can also be embedded in a green tape stack. Suitable resistor or capacitor inks can be screen printed onto green tapes to obtain tight tolerances and high precision placement of the passive components.

Screen printed capacitors are known based on barium titanate and lead magnesium niobate dielectrics. The selected dielectric is admixed with suitable glasses and an organic vehicle so as to obtain a capacitor ink which can have a wide range of dielectric constant. The capacitor ink is screen printed onto a green tape. The screen printed capacitor layers are connected to a silver conductor layer screen printed on green tape layers over and under the capacitor printed layer by means of vias in the green tape that are then filled with appropriate conductor via fill inks.

The above-described screen printed embedded capacitors, while they are an important advance in the art, have been limited in their dielectric constant and are limited in their size; which is dependent on the size of the chip to which they are used. In general, these embedded capacitors have a maximum practicable size of about 6×6 mm. Up till now, the highest dielectric constants achieved reproducibly for these buried capacitors has been about 1600. Thus a search has continued for screen printable capacitor inks and for capacitor structures having a high dielectric constant that can be made reproducibly.

SUMMARY OF THE INVENTION

We have developed capacitor ink formulations for applications such as memory modules requiring a high dielectric constant, of over about 2600 up to about 4500 or higher, depending on the size of the capacitor, having relatively low losses. These capacitor inks are based on lead-magnesium niobate dielectrics which are mixed with a lead oxide flux rather than with a glass, together with a suitable organic vehicle, so that the resultant capacitor ink can be sintered below 900° C. The capacitor inks can be screen printed onto a glass-based green tape, or cast as a green tape layer by suitable adjustment of the organic vehicle. The capacitors are completed by screen printing electrodes over and under the capacitor layer or green tape layer and electrically connecting them.

DETAILED DESCRIPTION OF THE INVENTION

Lead-magnesium-niobate (PMN) based capacitor inks known heretofore have been made from PMN including a small amount of barium titanate, and a finely divided glass, mixed with a suitable organic vehicle. However, their dielectric constant has been limited. Further, due to a dilution effect after firing from the glass of adjoining green tape layers, particularly when the capacitor is buried between glass-based green tape layers, the dielectric constant of the fired green tapes is generally lowered from its initial, unfired value.

Figure 1:
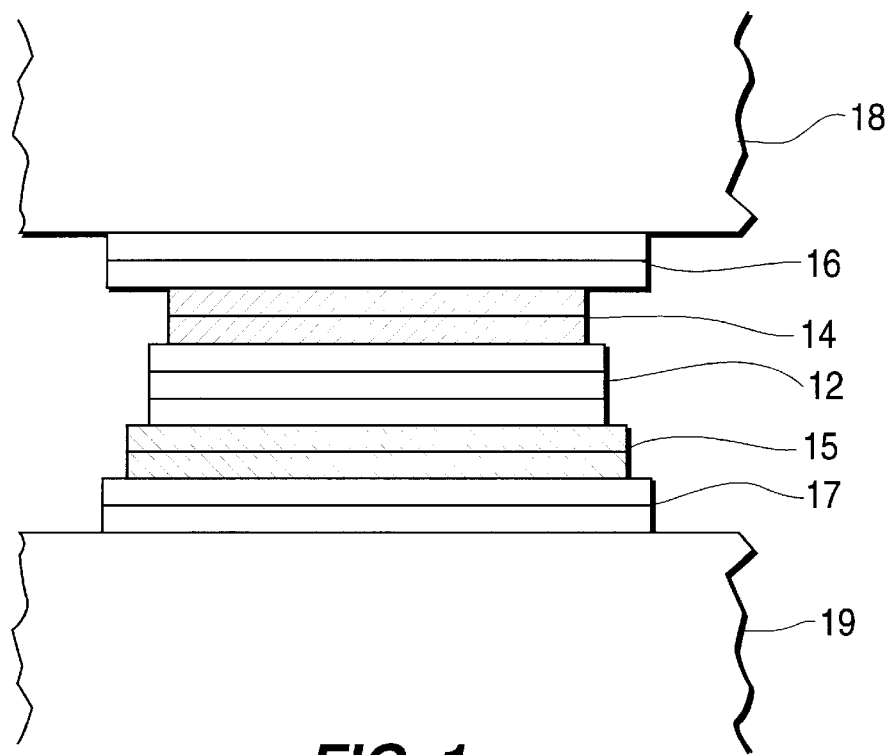
FIG. 1 is a cross sectional view of an embedded capacitor of the prior art.

In order to raise the dielectric constant, a barrier layer was tried to prevent this dilution effect. A low melt temperature glass was used for the barrier layers, one that would densify and crystallize at much lower temperatures than the glasses used for making the green tape and the capacitor inks. These barrier layers were screen printed above and below the buried capacitor. However, this solution requires several additional steps and thus adds to the cost of making screen printable, high dielectric constant capacitors. Such an embedded capacitor is shown in FIG. 1. A three layer capacitor 12 having a two layer top and bottom conductor layers 14 and 15 respectively is sandwiched between two top and bottom two layer barrier layers 16 and 17 respectively. The embedded capacitor is in turn laminated to top and bottom green tape stacks 18 and 19 respectively.

In the present formulations, lead oxide, also a low firing temperature material, is used to mix with the lead-magnesium-niobate capacitor dielectric to form a dielectric ink or a green tape, thereby reducing the dilution effect of glasses. The resultant screen printed capacitors have a nominal dielectric constant of from about 2800 to about 4500 with low loss tangents of 0.7% or less.

Suitable thick film capacitor inks useful in the present invention are made by combining lead-magnesium-niobate powder available from TAM Ceramics Inc as Y5V183U together with barium titanate powder available from the Degussa Corporation as AD302L, and lead oxide powder available from Mallincrodt Baker, Inc. These dielectric powders were mixed with a suitable organic vehicle. The main ingredients in these capacitor inks is lead-magnesium-niobate (PMN) powder. Lead oxide powder is added in an amount sufficient to reduce the firing temperature of the ink to below about 900° C. Two suitable dielectric inks are summarized below in parts by weight in Table I.

TABLE 1

| Ingredients | Ink 1 | Ink 2 |
|---|---|---|
| $BaTiO_3$ | 1.1 | 0.92 |
| PMN | 73.3 | 60.47 |
| PbO | 7.8 | 6.40 |
| Dispersant[1] | 1.6 | 13.90 |
| Resin/solvent[2] | 16.2 | 16.61 |
| Wetting agent[3] |  | 1.70 |

[1]Hypermer PS2, available from ICI
[2]VC-108
[3]Silwet L-7602 cf OSi Specialties, Inc The resin/solvent mixture used in ink 1 is made from 12% of ethyl cellulose having a molecular weight of 300 in a 60:40 mixture of butyl carbitol and dodecanol solvents.

The resin/solvent mixture used in ink 2 is made from 16.7% of Butvar B-98 resin, 11.1% Santicizer #160 plasticizer, both available from Monsanto Corp, 36.1% of ethanol and 36.1% of methyl ethyl ketone.

The dispersant used in Ink 1 is available as Hypermer PS2 available from ICI. For ink 2, this dispersant was diluted with 48.1% of ethanol and 48.1% of methyl ethyl ketone.

The resultant dielectric ink was screen printed onto a green tape layer. The dielectric ink screen printing step can be repeated so as to form a dielectric layer about 40–45 microns in thickness when dried. Using a 290 mesh, 1.0 mil emulsion screen, four screen printings were satisfactory.

The capacitor inks can be screen printed onto green tapes particularly formulated for co-firing onto metal support substrates. The primary crystallizing glass used in such green tape can be made from a mixture of the following oxides: 29.4% of ZnO, 24.5% of MgO, 19.6% of $B_2O_3$, 24.5% of $SiO_2$ and 2.0% of a coloring agent such as $Co_3O_4$, all in % by weight. Typical and useful green tape compositions are given below in Table II.

TABLE II

| Wt % $BaTiO_2$ | Glass # | Wt % | Dispersant Wt % | Resin Wt % | Solvent Wt % |
|---|---|---|---|---|---|
| 62.29 | 1* | 7.14 | 1.43 | 4.07 | 23.07 |
| 66.09 | 1 | 8.25 | 1.52 | 5.85 | 19.38 |
| 64.89 | 2** | 9.8 | 1.49 | 4.76 | 19.05 |
| 65.62 | 1 | 13.52 | 1.57 | 4.83 | 14.48 |
| 59.99 | 1 | 3.08 | 1.44 | 4.45 | 21.04 |
| 62.27 | 2 | 12.15 | 1.54 | 4.41 | 17.83 |

TABLE II-continued

| Wt % $BaTiO_2$ | Glass # | Wt % | Dispersant Wt % | Resin Wt % | Solvent Wt % |
|---|---|---|---|---|---|
| 60.86 | 2 | 15.34 | 1.52 | 4.46 | 17.82 |
| 57.05 | 2 | 15.35 | 1.54 | 4.47 | 17.89 |

*Glass 1 includes 6.0% $Al_2O_3$, 39.0% $B_2O_3$, 5.0% BaO and 50.0% ZnO
**Glass 2 includes 10.1% $Al_2O_3$, 50.0% PbO and 39.9% $SiO_2$ Termination conductive inks are suitably made from a silver conductor ink. A suitable termination ink was made as follows, in % by weight; 20.55% of silver powder, SPEG available from Degussa Corporation; 61.64% of silver flake, available as #15 also from Degussa Corporation; 0.55% of a glass available from SEM COM Corporation as SCC-11-35; 0.16% of bismuth oxide flux available from Mallincrodt Baker, Inc; 2.06% of a dispersant, a 50% mixture of lecithin in terpineol 318 solvent available from Hercules Corporation; and 15.04% of the mixed resin/solvent mixture described above for capacitor inks 1 and 2.

The termination conductor inks are screen printed onto green tapes to form layers underlying and overlying the capacitor. The termination conductor inks should have a dried thickness of at least 35 microns. This can be achieved by screen printing using a 290 mesh 1.0 mil emulsion screen in two prints.

The capacitors should be buried with at least one green tape overlying the top electrode, to prevent damage during the lamination step. The green tapes and the capacitor stack are aligned and laminated using a pressure of about 15,000 lbs. The laminated green tape-capacitor stack is then co-laminated to a metal support board at a pressure of about 10,000 lbs. A suitable metal support board is made of an iron-nickel-cobalt-manganese alloy that shows a rapid change in its coefficient of expansion at the crystallization temperature of the glass used to make the green tape, suitably a board made from an alloy of Fe, 53.8%; Ni, 29%; Co, 17%; and Mn, 0.2%, all % by weight.

The laminated, supported green tape stack is then fired at a temperature up to about 865° C.

Test capacitors were made including four each of three different size capacitors; 200 mil square, 100 mil square and 50 mil square. The capacitance, C, and dielectric loss δ were measured at 10 kHz using a LCR meter. The dielectric constant, K, is calculated from the formula $K = Ct/A\epsilon_0$ wherein A is the area of the capacitor, t is the thickness of the dielectric and $\epsilon_0$ is the permittivity of free space.

The dielectric constant K and dielectric loss (tan δ) values for the three capacitor sizes are summarized below.

| Capacitor size | K | tan δ |
|---|---|---|
| 200 mil | 4471 | 0.0071 |
| 100 mil | 4262 | 0.0052 |
| 50 mil | 2809 | 0.0048 |

It is apparent that in order to obtain high dielectric constant value capacitors, the area of the capacitors also must be increased. However, very large capacitors are impractical to fabricate as single layers, even using high value dielectric materials.

An alternate way of making high dielectric constant capacitors is to make multiple layers of green tape capacitors using the basic screen printable capacitor ink mixture itself to form the dielectric green tapes, with suitable adjustments to the organic vehicle. The ink mixture can be ball milled using ⅜" zirconia balls for two hours and passed through a 70 mesh screen. Green tapes were cast by doctor blading with a 6 mil gap. After drying, the dielectric green tapes were about 1.8–2.2 mils thick, with a green density of about 4.35–4.5 g/ml.

A plurality of high dielectric constant green tapes are aligned together with alternate metal electrode layers. Alternate electrode layers are then connected together in parallel by means of suitable via fill inks. The capacitance of the multiple layer capacitors then add, permitting the formation of very high dielectric constant capacitors, without having to form large area capacitors.

Figure 2:
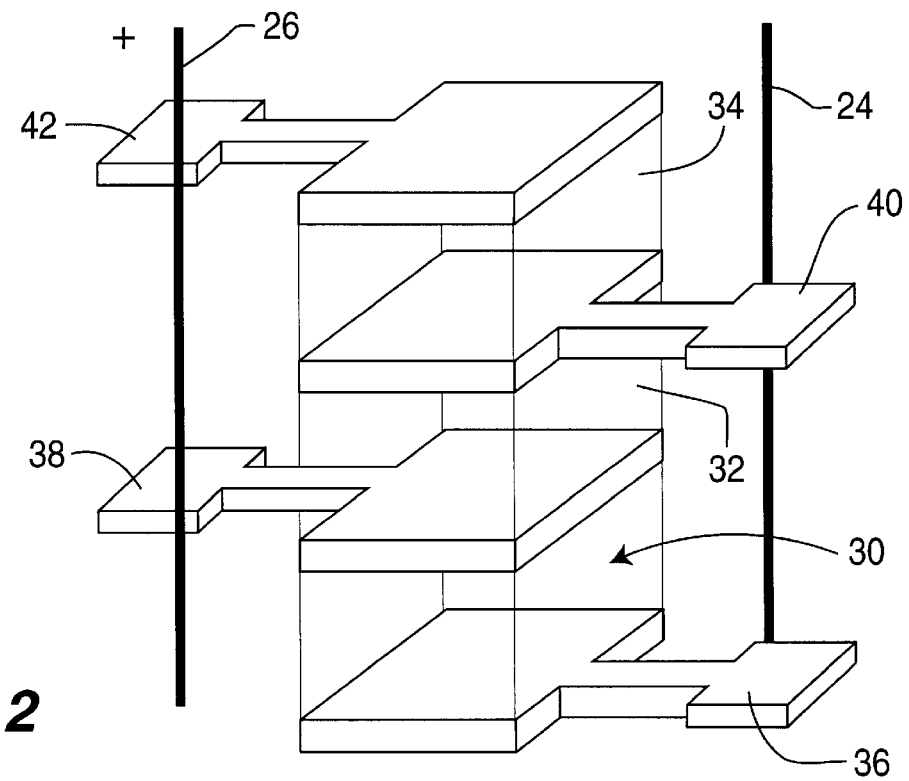
FIG. 2 is an exploded view of a test multilayer capacitor of the invention.

FIG. 2 illustrates the capacitor obtained using this method. Referring to FIG. 2, high dielectric constant green tape layers 30, 32, 34 are formed as described above. Electrodes 36, 38, 40 16 and 42 are screen printed onto each of the high dielectric constant green tapes 30, 32 and 34. Vias are made in the electrode layers and alternate electrodes are connected together by means of conductive via fill inks, shown as vias 24 and 26. The resultant multilayer capacitor stack have capacitances that add, thus producing very high values without having to make each capacitor correspondingly large in area. Each of the capacitors can be made quite small in area, but when they are stacked together and connected in parallel, very high dielectric constant values can be obtained.

The multilayer capacitor stack can then be incorporated or buried in a conventional green tape stack as described above supported by a metal support substrate. For example, the green tapes can be TCE matched to silicon or gallium arsenide for example in known manner. The resultant buried capacitor green tape stacks can be fired at temperatures below about 900° C.

Electrodes were screen printed onto the above dielectric green tapes using the termination conductor inks described hereinabove.

An assembly was made from a conductive ink coated high dielectric tape sandwiched between one coated and one uncoated high dielectric tape, and three layers made from gallium arsenide TCE matched green tapes. This assembly was co-laminated to the metal alloy board described above in known manner and cofired at a peak temperature of 865° C.

Capacitance results are given below for electrodes 200× 200 mils in size.

| Capacitance, nF | K | tan δ |
|---|---|---|
| 28.3 | 3098 | 0.0092 |
| 28.9 | 3164 | 0.0091 |
| 28.8 | 3153 | 0.0089 |

Thus high dielectric, low loss capacitors were obtained having a small overall size.

The above dielectric green tapes and conductor inks were used to make an assembly including 5 active capacitor layers, cut into capacitors 5×5 mm, 6×6 mm and 7×7 mm in size respectively. Capacitance and dielectric loss results for four capacitors of each sized are summarized below.

| Size | C(nF) | tan δ | Av. C | K |
|---|---|---|---|---|
| 5 × 5 | 187 | 0.026 | | |
| | 184 | 0.026 | | |
| | 195 | 0.028 | | |
| | 195 | 0.029 | 190 ± 3% | 4407 |
| 6 × 6 | 321 | 0.037 | | |
| | 314 | 0.036 | | |
| | 320 | 0.035 | | |
| | 314 | 0.051 | 317 ± 1.3% | 4974 |
| 7 × 7 | 532 | 0.049 | | |
| | 527 | 0.048 | | |
| | 532 | 0.052 | | |
| | 523 | 0.053 | 529 ± 1.0% | 6111 |

It is apparent that the multilayer capacitors have very high dielectric constants along with capacitance tolerances of about 3% or less. This is substantially lower than the tolerances conventional buried capacitors, which can be as high as 25–30%.

The above structures are useful in various applications, such as memory modules.

Although the invention has been described by way of certain specific embodiments, one skilled in the art will be able to substitute other capacitor compositions, conductor layers and green tape dielectric layers for those described above, and for lamination and firing conditions. Such variations are meant to be included herein and the invention is meant to be limited only by the scope of the appended claims.

What is claimed is:

1. A screen printable ink for making capacitors having a dielectric constant of from about 2800 to about 4500 with loss tangents of 0.7% or less of a mixture of lead-magnesium-niobate powder, about 10% by weight of the ink of lead oxide powder, about 1% by weight of the ink of barium titanate, and an organic vehicle, said ink being sinterable below 900° C.

2. A multilayer green tape stack having a buried capacitor therein, said buried capacitor made by coating a glass-based green tape with the following layers in sequence:
   a) a conductor ink,
   b) a capacitor ink of claim 1; and
   c) a conductive layer.

3. A multilayer green tape stack according to claim 2 wherein the capacitor ink layer is about 40–45 microns in thickness when dried.

4. A multilayer green tape stack according to claim 3 wherein the conductive layers are at least about 35 microns in thickness when dried.

5. A dielectric green tape made from the composition of claim 1.

6. A dielectric green tape according to claim 5 having a conductive layer thereon.

7. A dielectric green tape according to claim 3 wherein the conductive layer is made of silver.

8. A multilayer green tape stack of the dielectric green tapes of claim 5 wherein each of said green tapes has a conductive layer thereon and the conductive layers are electrically connected in parallel.

9. A multilayer green tape stack according to claim 8 wherein the conductive layers are made from silver.

10. A multilayer green tape stack according to claim 9 wherein the silver is made from a mixture of silver powder and silver flake.

11. A dielectric green tape stack according to claim 8 wherein the conductive layer is at least 35 microns in thickness when dried.

12. A multilayer green tape stack of the dielectric green tapes of claim 5 wherein said dielectric green tapes are sandwiched between glass-based green tape layers.

13. A multilayer green tape stack of dielectric green tapes made from a mixture of lead-magnesium-niobate powder, about 10% by weight of the mixture of lead oxide powder, about 1% by weight of the mixture of barium titanate and an organic vehicle that is sinterable below 900° C. sandwiched between glas-based green tape layers, wherein the glass-based green tapes are supported by a metal support board.

14. An embedded capacitor having a dielectric constant of at least 2600 comprising
   a) a pluirality of glass-based green tapes, each glass-based green tape having printed circuitry thereon;
   b) a multilayer capacitor comprising a dielectric green tape made by depositing a layer made from a capacitor ink of a mixture of lead-magnesium-niobate powder, about 10% by weight of the ink of lead oxide powder, and about 1% by weight of the ink of barium titanate, and an organic vehicle, the dielectric green tape coated with a silver conductor layer; and
   c) one or two layers of glass-based green tape over the capacitor.

15. An embedded capacitor according to claim 14 wherein the plurality of glass-based green tapes are supported by a metal support substrate.

16. An embedded capacitor according to claim 14 wherein a plurality of dielectric green tapes are stacked, each coated with a silver conductor layer, the conductor layers alternately connected in parallel.

17. A method of making embedded high dielectric constant capacitors comprising
   a) stacking a plurality of glass-based green tapes having circuitry thereon;
   b) stacking a plurality of dielectric green tapes made from lead-magnesium-niobate, barium titanate and lead oxide powders, each coated with a conductive layer of silver;
   c) assembling a multilayer tape stack comprising the glass-based green tapes of step a), the dielectric green tapes of step b) and one or two overlying glass-based green tapes,
   d) laminating the stack, and
   e) firing the stack at a temperature below about 900° C.

18. A method according to claim 17 wherein a metal support board is bonded to the green tape stack.

19. An embedded capacitor having a dielectric constant of at least 2600 comprising
   a) a plurality of glass-based green tapes, each glass-based green tape having printed circuitry thereon,
   b) a multilayer capacitor comprising a dielectric green tape made from a mixture of lead-magnesium-niobate powder, lead oxide powder, barium titanate and an organic vehicle, the dielectric green tape coated with a silver conductor layer; and
   c) one or two layers of glass-based green tape over the capacitor layer, wherein the glass-based green tapes are TCE matched to gallium arsenide.

* * * * *